United States Patent [19]

Wang

[11] Patent Number: 4,525,239
[45] Date of Patent: Jun. 25, 1985

[54] EXTRINSIC GETTERING OF GAAS WAFERS FOR MESFETS AND INTEGRATED CIRCUITS

[75] Inventor: Faa-Ching Wang, Rohnert Park, Calif.

[73] Assignee: Hewlett-Packard Company, Palo Alto, Calif.

[21] Appl. No.: 602,833

[22] Filed: Apr. 23, 1984

[51] Int. Cl.³ .................. B44C 1/22; C03C 15/00; C03C 25/06

[52] U.S. Cl. .................. 156/645; 51/281 R; 148/191; 156/643; 156/657

[58] Field of Search .................. 156/628, 643, 645, 651, 156/657, 662; 219/121 L, 121 LH, 121 LJ, 121 LM; 51/281 R; 148/191; 29/575

[56] References Cited

U.S. PATENT DOCUMENTS 3,632,438  1/1972  Carlson et al. .................. 156/662 X
3,811,975  5/1974  Lierop et al. .................. 156/657
3,929,529  12/1975  Poponiak .................. 156/662 X Primary Examiner—William A. Powell
Attorney, Agent, or Firm—Patrick J. Barrett

[57] ABSTRACT

A method is disclosed for extrinsically gettering imperfections in a semi-insulating GaAs wafer. This is accomplished by subjecting the semi-insulating GaAs wafers to processing conditions which allow the imperfections to migrate toward a mechanically damaged surface region of the wafer. Migration occurs during a low temperature heat treatment over an extended time period. The GaAs wafer surface is damaged by a bead blasting treatment and subsequently heated to a temperature in the range of 400 to 600 degrees Celsius in a forming gas for a period between 12 to 120 hours. Significant improvements of the GaAs wafer qualities and performance of fabricated MESFET devices are achieved.

7 Claims, 7 Drawing Figures

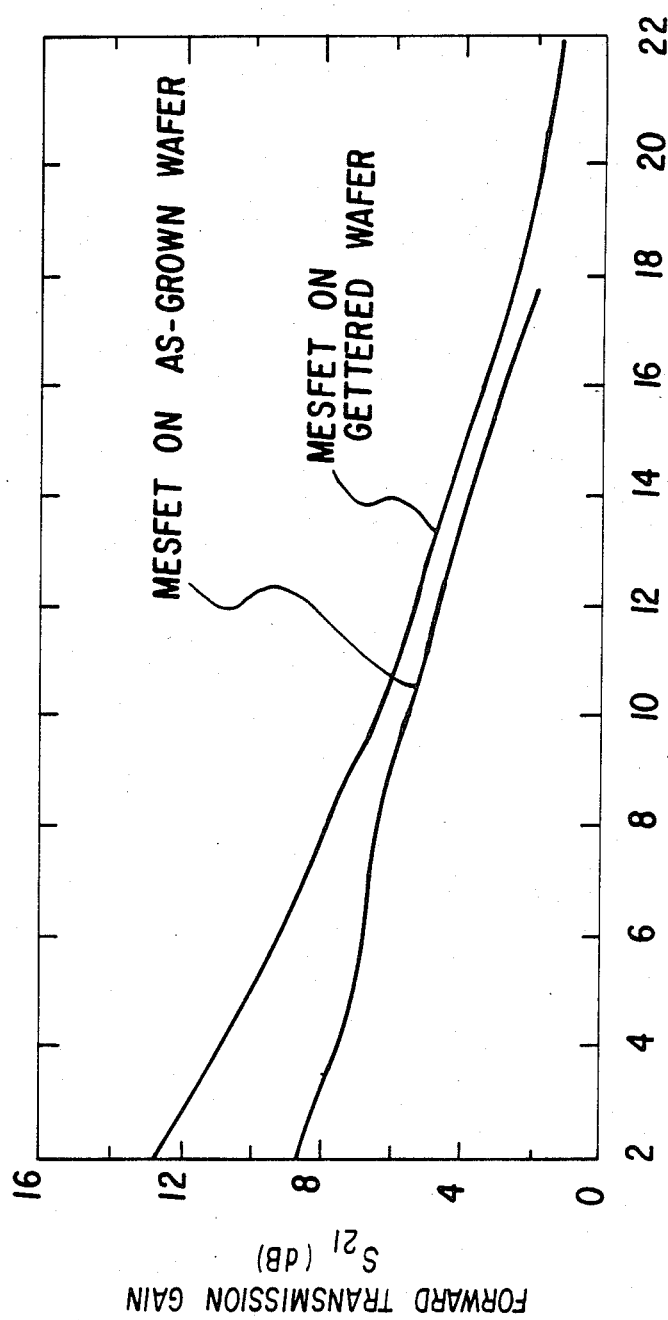

EXTRINSIC GETTERING OF GAAS WAFERS FOR MESFETS AND INTEGRATED CIRCUITS

BACKGROUND

This invention relates to a method for isolating imperfections in semi-insulating GaAs wafers used in the fabrication of metal-semiconductor field effect transistors (MESFETs) and integrated circuits.

Semi-insulating GaAs material grown by Liquid Encapsulation Czochralski (LEC) techniques is currently used as starting material for direct ion implanted MESFET and integrated circuit fabrication. The semi-insulating characteristic (resistivity typically in the range of $10^7$ ohm-cm to $10^{10}$ ohm-cm) of the GaAs material is formed during LEC growth. GaAs wafers made from this starting material display poor intrinsic material properties, such as purity, uniformity, and electron mobility. These properties are inherent in the material as a result of LEC crystal growth and have a significant impact on the speed performance and yield of fabricated devices. However, significant improvement of these properties during LEC growth is difficult because of insufficient growth control capability. Therefore, improvements after LEC growth are a more practical approach. One way to accomplish this is by extrinsic gettering techniques. The aim of extrinsic gettering is to isolate imperfections, such as impurities, structural defects, and precipitates, by moving the imperfections away from the active area in the semi-insulating GaAs material to other areas (the wafer backface, for example) where they have minimum effect on device performance.

SUMMARY OF THE INVENTION

The preferred embodiment of the present invention uses extrinsic gettering in the preparation of semi-insulating GaAs wafers for fabrication of MESFETs and integrated circuits. A semi-insulating GaAs wafer having a polished and an unpolished surface is coated with an insulating layer, such as silicon dioxide, on both surfaces. The unpolished surface of the wafer is subjected to bead blasting to generate mechanical damage at the unpolished surface. The wafer is then heated in a forming gas to a temperature in the range of 400–600 degrees Celsius for a period of time in the range of 12 to 120 hours. Imperfections present in the GaAs wafer migrate toward the damaged surface during the heat treatment. The insulating layer is removed from the polished surface and the wafers are now ready for device fabrication. Significant improvements of the material qualities of the semi-insulating GaAs wafers and performance of direct ion implanted MESFET devices are achieved using this extrinsic gettering technique.

DETAILED DESCRIPTION OF THE DRAWINGS

FIG. 6 shows a comparison of the forward transmission gain-frequency characteristics of a GaAs MESFET device before and after gettering according to the preferred embodiment.

DETAILED DESCRIPTION OF THE PREFERRED EMBODIMENT

Figure 1:
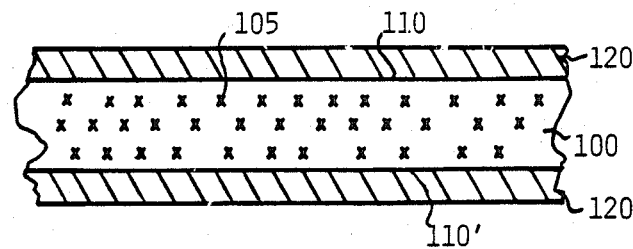
FIG. 1 shows a cross-section view of a semi-insulating GaAs wafer prior to gettering according to the preferred embodiment.

FIG. 1 shows a cross-section of an as-grown semi-insulating GaAs semiconductor structure prior to gettering by the technique of the preferred embodiment. An insulating layer 120 is grown over polished surface 110 and unpolished surface 110' of semi-insulating GaAs wafer 100 using standard thermal oxidation or chemical vapor deposition techniques. The insulating layer 120 is typically silicon dioxide having a thickness in the range of 6500 to 7000 and 2000 to 2600 Angstroms on polished surface 110 and unpolished surface 110', respectively. Other materials that can be used for insulating layer 120 are silicon nitride and aluminum nitride. Insulating layer 120 is used as a protective coating for polished surface 110. Imperfections 105, such as impurities, structural defects, and precipitates, are present throughout semi-insulating GaAs wafer 100.

Figure 2:
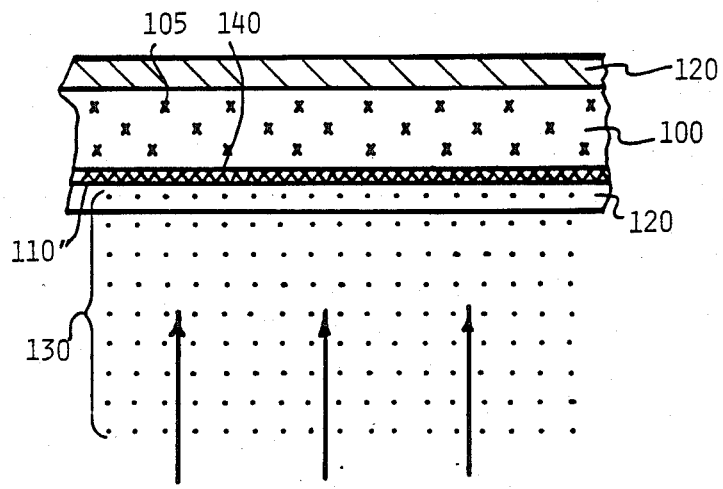
FIG. 2 shows the wafer illustrated in FIG. 1 during mechanical damage according to the preferred embodiment.

FIG. 2 shows a cross-section of the structure illustrated in FIG. 1 during a mechanical damage step. Unpolished surface 110' is subjected to extrinsic gettering beginning with a treatment in which a stream of beads 130 bombard unpolished surface 110'. The stream of beads 130 removes silicon dioxide layer 120 on unpolished surface 110' and mechanically damages unpolished surface 110' producing surface damage region 140. Surface damaged region 140 contains primarily imperfections such as dislocations, stacking faults and amorphous regions caused by the effect of bead bombardment and mechanical stress. Mechanical stress comes about because of intrinsic lattice mismatch during GaAs growth (see S. K. Ghandhi, VLSI Fabrication Priciples Silicon and Gallium Arsenide, Wiley, New York, 1983 pp 587–589).

Bead blasting was performed by an S.S. White Industrial Airbrasive Unit, Model F bead blasting machine. Blasting beads used in this unit are typically aluminum oxide particles 50 micro meters in diameter. Standard operating conditions include a presure setting of 100 PSIG for a period of time between 4 to 16 secs/cm$^2$. Other less effective ways to mechanically damage unpolished surface 110' include mechanical lapping, laser damage, heavy ion implantation at high doses, and any other methods of generating stress at the unpolished surface.

Figure 3:
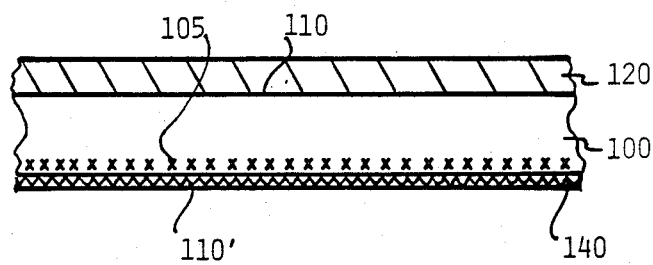
FIG. 3 shows the structure illustrated in FIG. 2 after subsequent processing steps.

Subsequent heat treatment of semi-insulating GaAs wafer 100 allows damaged region 140 to act as a sink for the removal of imperfections 105 away from the polished surface 110 of semi-insulating GaAs wafer 100 as illustrated in FIG. 3. Typically, semi-insulating GaAs wafer 100 is heated in a forming gas containing about 3% Hydrogen and another gas, such as Nitrogen or Argon, to a temperature in the range of 400 to 600 degrees Celsius for a time period of 12 to 120 hours. Good results have been obtained by heating semi-insulating GaAs wafer 100 to a temperature of 500 degrees celsius for 24 hours. In order to ensure both the removal of imperfections 105 and preserve the semi-insulating properties of GaAs wafer 100, gettering conditions as illustrated in Table 1 below are followed.

TABLE 1

| Temperature | Forming Gas (3% Hydrogen) | Time |
| --- | --- | --- |
| 400 degrees Celsius | Nitrogen or Argon | 60–120 hours |
| 450 degrees Celsius | Nitrogen or Argon | 24–96 hours |
| 500 degrees Celsius | Nitrogen or Argon | 12–64 hours |
| 600 degrees Celsius | Nitrogen or Argon | 24 hours |

Figure 4:
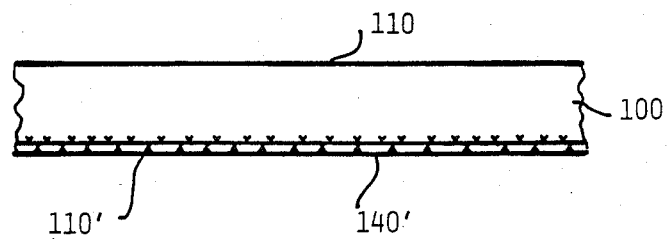
FIG. 4 shows the structure illustrated in FIG. 3 in preparation for device fabrication.

FIG. 4 shows the gettered GaAs wafer ready for device fabrication. Insulating layer 120 is removed from surface 110 by conventional etching techniques. Damaged region 140' need not be removed prior to subsequent processing steps but if desired, damaged surface region 140' can be removed by mechanical lapping techniques. A significant improvement in MESFET device performance is obtained after direct ion implantation of the wafers processed by the above method. In a typical MESFET device the gate dimensions are 1 micrometer by 350 micrometer with a 3.5 micrometer source-drain spacing and a peak doping level of $1.5–2.0 \times 10^{17}$ cm$^{-3}$.

Figure 5B:
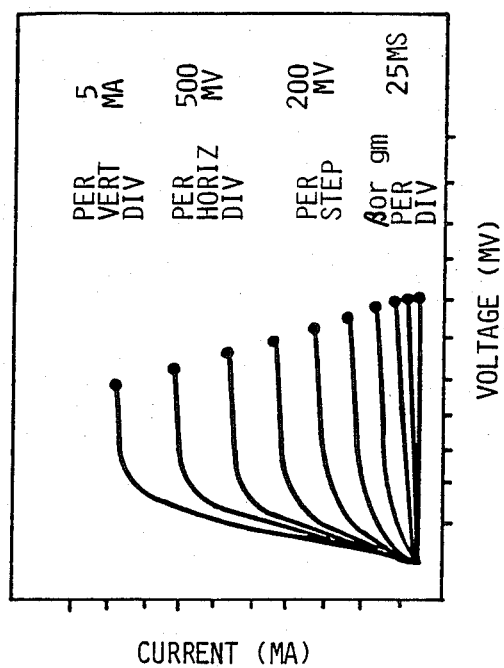
FIG. 5B shows the current-voltage characteristics of an as-grown GaAs MESFET without use of the gettering technique of the preferred embodiment.
Figure 5A:
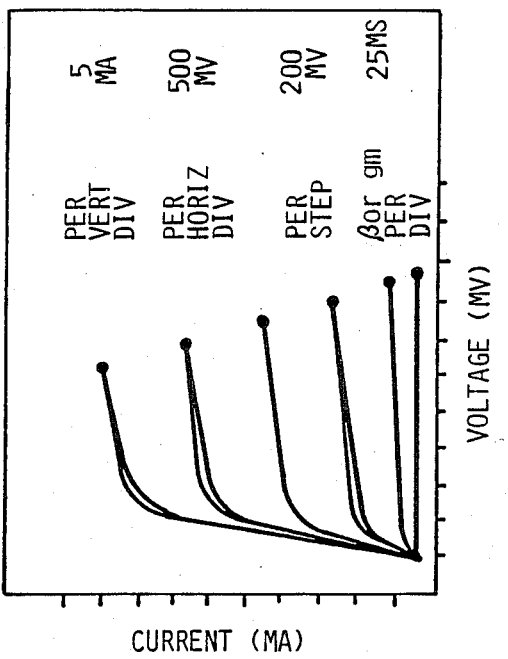
FIG. 5A shows the current-voltage characteristics of a GaAs MESFET device after gettering according to the preferred embodiment.

Values of transconductance as high as 190 millisiemens per millimeter are measured for devices fabricated on gettered wafers as compared to 130 millisiemens per millimeter for devices fabricated on as-grown wafers, while capacitance is unaffected. FIG. 5A and FIG. 5B show the current-voltage characteristics of two MESFETs fabricated on gettered and as-grown substrates, respectively. Current-voltage curves of the MESFET device fabricated on the gettered substrate shown in FIG. 5A show that transconductance 60 millisiemens corresponding to a step size of 0.2 volts for the gate voltage as compared to the transconductance and step size in FIG. 5B of 40 millisiemens demonstrates a 50% improvement of the transconductance of MESFET devices fabricated on gettered GaAs wafers. As shown in FIG. 6, measurements of scattering parameters of a MESFET device fabricated on a gettered wafer and used in the common source configuration, specifically forward transmission gain, $S_{21}$ show a 40–50% improvement of both the magnitude and the frequency for unity transmission gain over MESFET fabricated on as-grown wafers and is consistent with transconductance measurements shown in FIG. 5A. An increase of at least 25% of two-carrier mobilities before and after the ion implantation are also observed on the gettered wafer. Bulk resistivity in the range of $1 \times 10^8$ to $5 \times 10^8$ ohms/cm and two-carrier mobility in the range of 3500 to 4000 cm$^2$/V-sec values are typical.

What is claimed is:

1. A method for isolating imperfections in a GaAs wafer having first and second surfaces, comprising the steps of:
    forming an insulating layer over the first and second surfaces;
    mechanically treating one of the first and second surfaces to produce a surface damage layer;
    heating said substrate in a forming gas to a temperature no higher than a temperature required to maintain the substrate at a semi-insulating condition;
    maintaining said temperature over a period of time sufficient for the imperfections to migrate in the substrate toward said damaged surface layer; and
    removing said insulating layer over said surface not mechanically damaged.

2. A method as in claim 1 wherein said insulating layer comprises silicon dioxide.

3. A method as in claim 1 wherein said mechanical treating comprises bead blasting.

4. A method as in claim 3 wherein said temperature is in the range of 400 to 600 degrees Celsius.

5. A method as in claim 4 wherein said period is in the range of 12 to 120 hours.

6. A method as in claim 1 further comprising the step of:
    removing said damaged surface layer.

7. A method as in claim 6 wherein the step of removing said damaged surface comprises mechanical lapping.

* * * * *